United States Patent [19]

Lalumia et al.

[11] 4,228,448
[45] Oct. 14, 1980

[54] BIPOLAR INTEGRATED SEMICONDUCTOR STRUCTURE INCLUDING I²L AND LINEAR TYPE DEVICES AND FABRICATION METHODS THEREFOR

[75] Inventors: Thomas M. Lalumia; James N. Fordemwalt, both of Tucson, Ariz.

[73] Assignee: Burr Brown Research Corp., Tucson, Ariz.

[21] Appl. No.: 840,397

[22] Filed: Oct. 7, 1977

[51] Int. Cl.³ .......................................... H01L 27/02
[52] U.S. Cl. ..................................... 357/46; 357/48; 357/92
[58] Field of Search .................. 357/92, 40, 46, 48

[56] References Cited
U.S. PATENT DOCUMENTS

| 4,081,697 | 3/1978 | Nakano | 357/92 |
| 4,087,900 | 5/1978 | Yiannoulos | 357/92 |

*Primary Examiner*—Edward J. Wojciechowicz
*Attorney, Agent, or Firm*—Harry M. Weiss

[57] ABSTRACT

This disclosure relates to a bipolar integrated semiconductor structure that has incorporated therein both I²L and linear type bipolar devices. The integrated structure utilizes a double epitaxial layer deposited or formed on a starting substrate wherein at least one linear type bipolar device is incorporated in one portion of the final integrated structure and at least one I²L bipolar device is incorporated in another portion of the final double epitaxial layer integrated structure. For the linear type bipolar device, the subcollector region is selectively located between the starting substrate and the first epitaxial layer whereas for the I²L bipolar device, the sub-emitter region is selectively located between the first and the second epitaxial layers. Other features of the bipolar integrated semiconductor structure include polysilicon isolation for the I²L and linear devices, up and down diffused PN junction isolation type regions, up-diffused base region for the I²L device, Schottky type collectors for the I²L device, up and down diffused base regions for the I²L device isolate the collector contacts, and the use of another subcollector region selectively located between the first and the second epitaxial layer in the linear portion of the integrated semiconductor structure which functions to improve the current gain of the lateral PNP linear transistor device.

29 Claims, 7 Drawing Figures

STEP A

STEP B

STEP C

STEP D

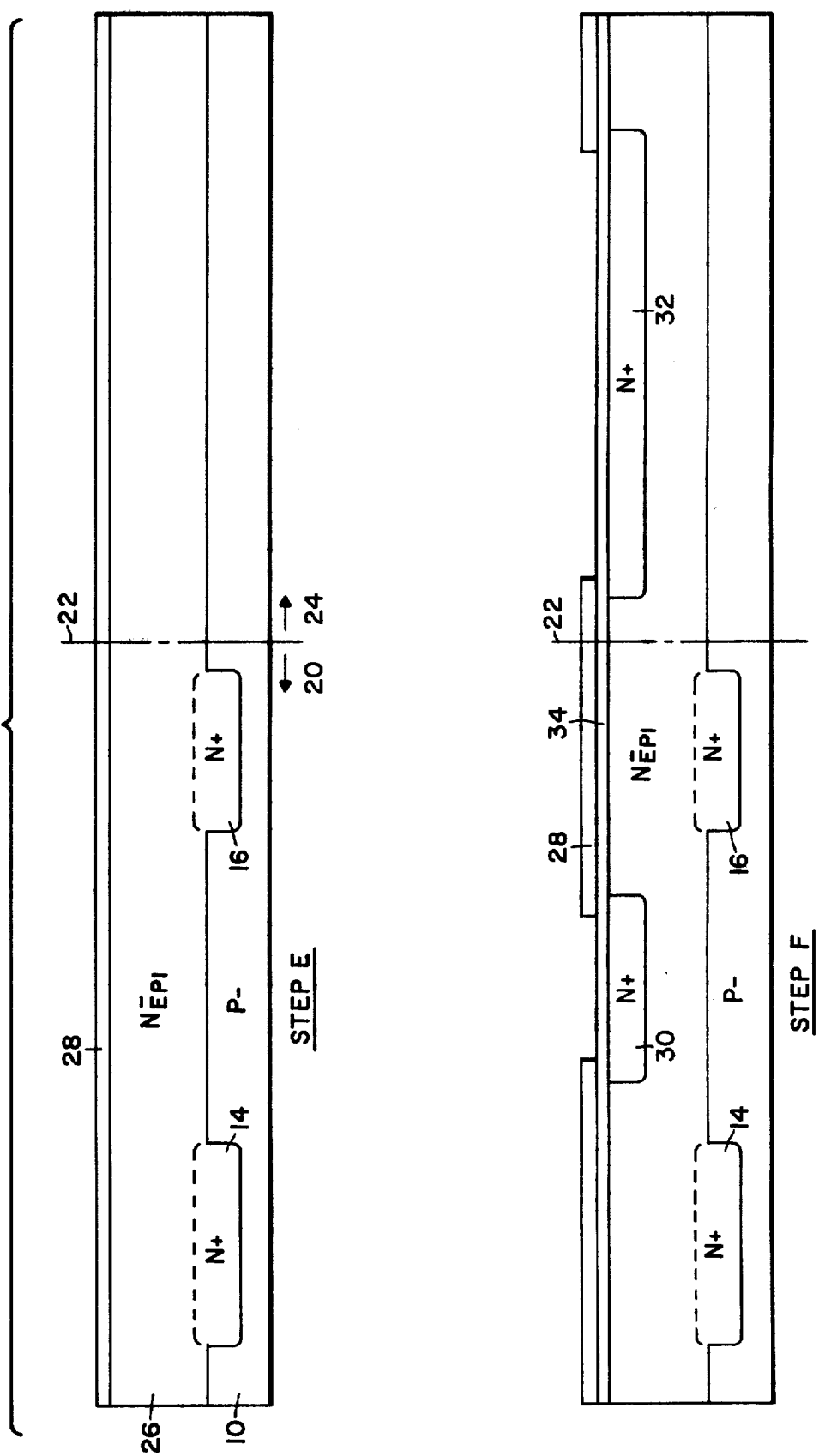

STEP H-1

STEP H-1-A

STEP I-1

STEP H-2

STEP I-2

STEP J-2

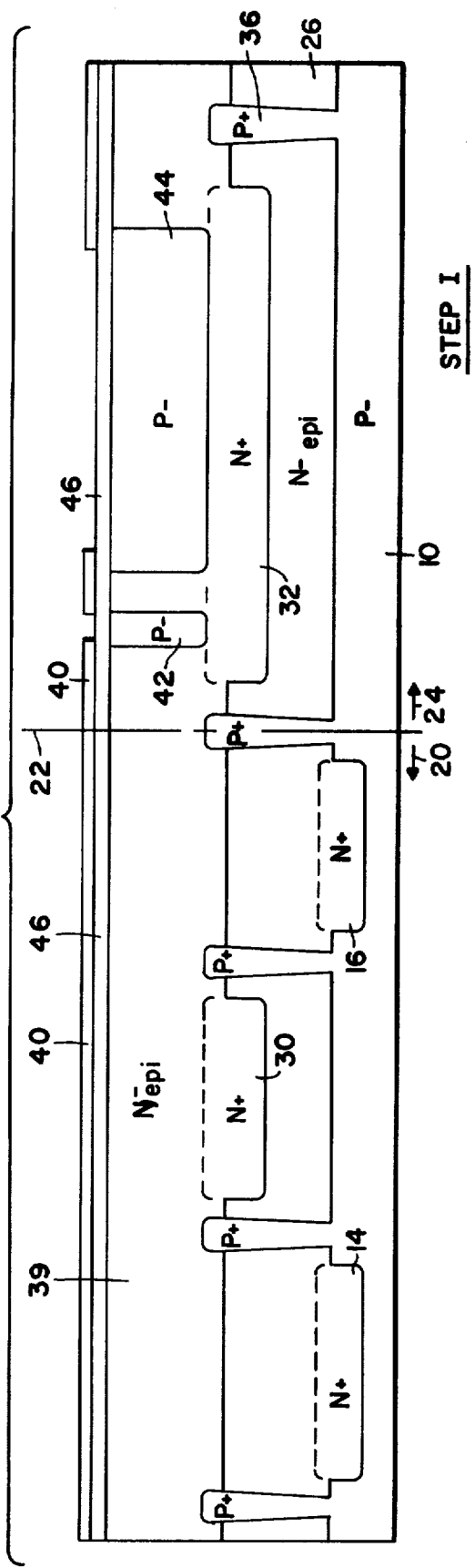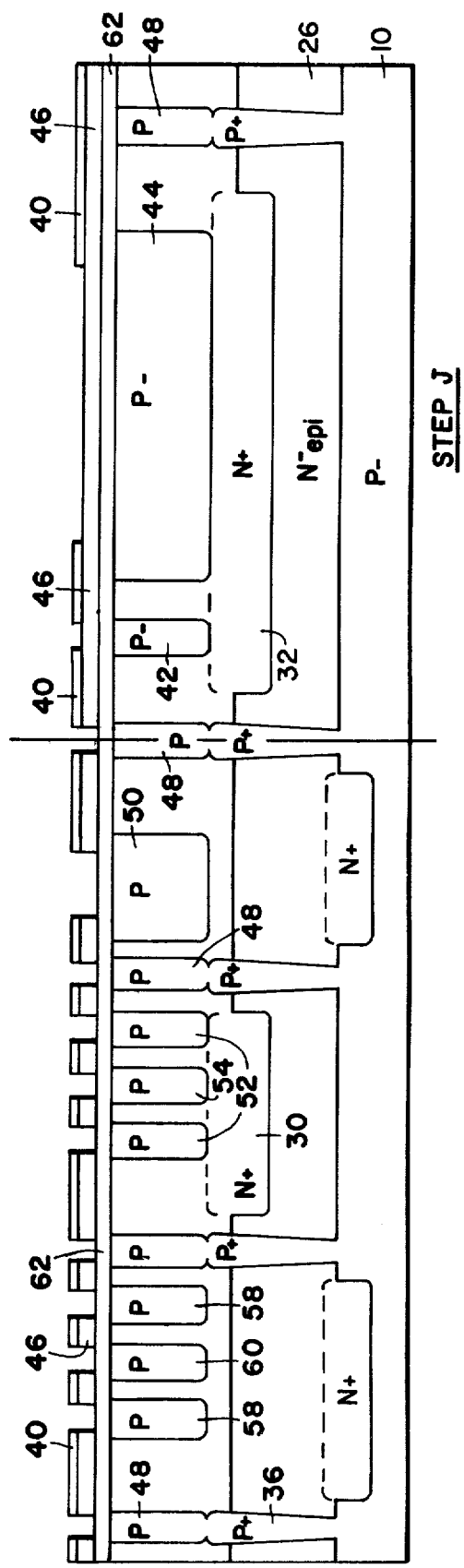
FIG. 2 — STEP I, STEP J

STEP J-1

STEP K-1

STEP L-1

STEP J-3

STEP K-3

STEP L-3

STEP K-2

STEP L-2

STEP L-2-A

STEP M-3

STEP M-3-A

BIPOLAR INTEGRATED SEMICONDUCTOR STRUCTURE INCLUDING I²L AND LINEAR TYPE DEVICES AND FABRICATION METHODS THEREFOR

BACKGROUND OF THE INVENTION

1. Field of the Invention

This invention relates generally to integrated simiconductor structures, and more particularly, to integrated semiconductor structures which incorporate both linear and I²L type bipolar devices and fabrication methods therefor.

2. Description of the Prior Art

In the past, various integrated semiconductor structures have been designed which have incorporated generally one type of device such as a linear type device or a digital type device such as, for example, I²L type devices.

However, as the technology made significant advances, integrated circuit designers began to realize that there were great advantages to incorporating more than one type of device and circuit into the same integrated structure. Thus, the technology advanced to the point where integrated circuit designers began to incorporate both linear and I²L type structures and circuits into a single monolithic integrated semiconductor structure for the obvious advantages of having both linear and digital type circuits in one monolithic integrated semiconductor structure or chip. The particular advantage of incorporating I²L and linear type devices and circuits in a single monolithic integrated structure is that I²L type devices are generally considered to be compatible to linear type devices because they both can use the same type of semiconductor processing to form the various regions which make up both the linear and I²L type structures.

Certain very significant disadvantages became readily apparent in fabricating integrated semiconductor structures which utilized both linear and I²L type devices in the same monolithic integrated semiconductor structure. One of these major disadvantages was the lack of compatibility in the resistivity (of the epitaxial layer) needed for the linear type device as compared to the resistivity required (for the epitaxial layer) used in the I²L type device. Monolithic integrated structures that used either the linear type resistivity for the epitaxial region for both the linear and the I²L type devices or the I²L type resistivity for the epitaxial region for both the linear and the I²L type devices usually resulted in low efficiency devices being made for either the linear portion (of the monolithic integrated semiconductor structure) or the I²L portion.

The use of thick epitaxial layers for these types of monolithic integrated semiconductor structures could not be tolerated for the I²L portion of the integrated structure whereas the use of thin epitaxial regions, while providing advantages for the I²L portion of the structure, caused a reduction in the performance of the linear portion of the integrated structure. Thus, a great dilemma existed as to how to incorporate both linear and I²L type bipolar devices in a single integrated structure and make them both operate at optimum efficiencies.

Accordingly, a need existed to provide a monolithic integrated semiconductor structure and fabrication process therefor that could utilize both I²L type devices and linear type devices wherein both the linear and I²L devices could operate with maximum efficiency.

SUMMARY OF THE INVENTION

It is an object of this invention to provide an improved monolithic integrated semiconductor structure.

It is a further object of this invention to provide an improved monolithic integrated semiconductor structure which incorporates both linear and I²L type structures.

It is another object of this invention to provide an improved monolithic integrated semiconductor structure which optimizes the performance of both the linear and I²L devices located in the integrated structure.

The foregoing, and other objects, features, and advantages of the invention will be apparent from the following, more particular description of the preferred embodiments of the invention, as illustrated in the accompanying drawings.

THE SPECIFICATION

Figure 1:
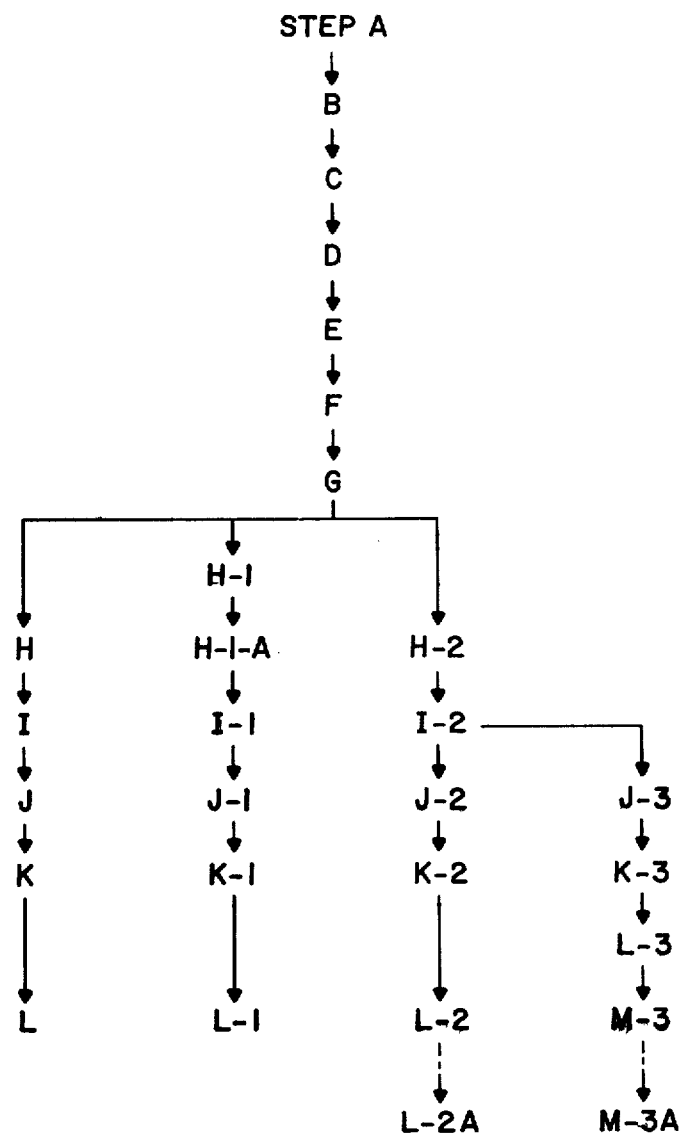
FIG. 1 is a flow diagram, in outline form, showing the Steps (as further shown in greater detail in FIG. 2) in the process of making the improved monolithic integrated semiconductor structure of this invention together with the four main integrated structure variations plus two additional integrated structure options.
Figure 2:
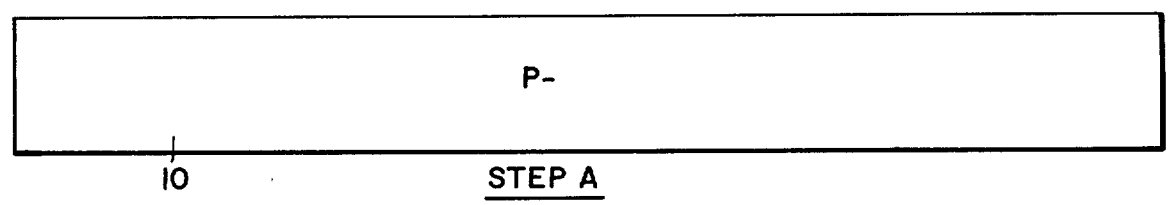
FIG. 2 is a flow diagram, in cross section, depicting all the Steps in the process for fabricating the monolithic integrated semiconductor structure of this invention with the four main integrated structure variations plus the two additional integrated structure options.
Figure 2:
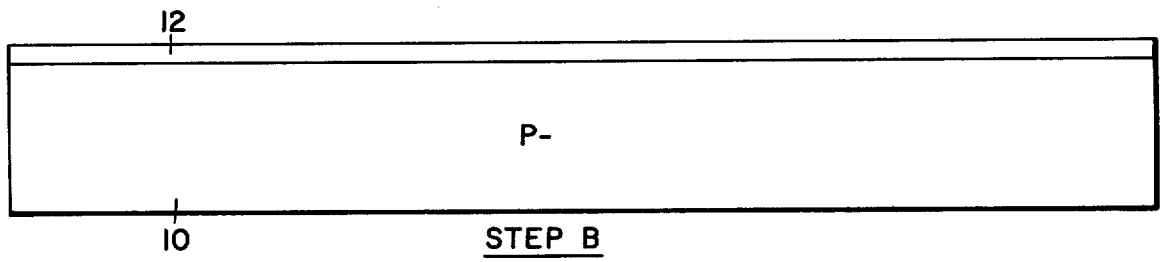
Figure 2:
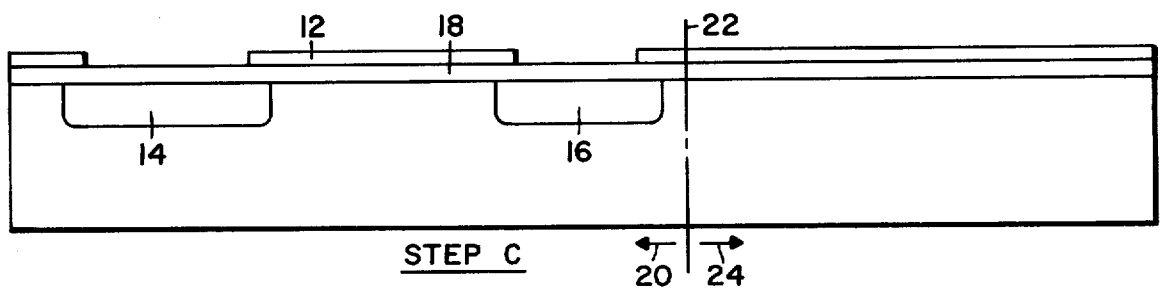
Figure 2:
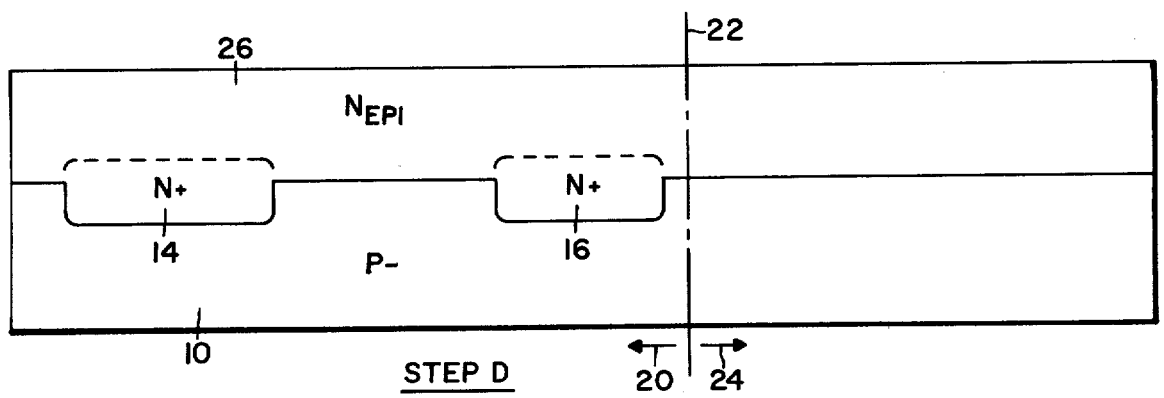
Figure 2:
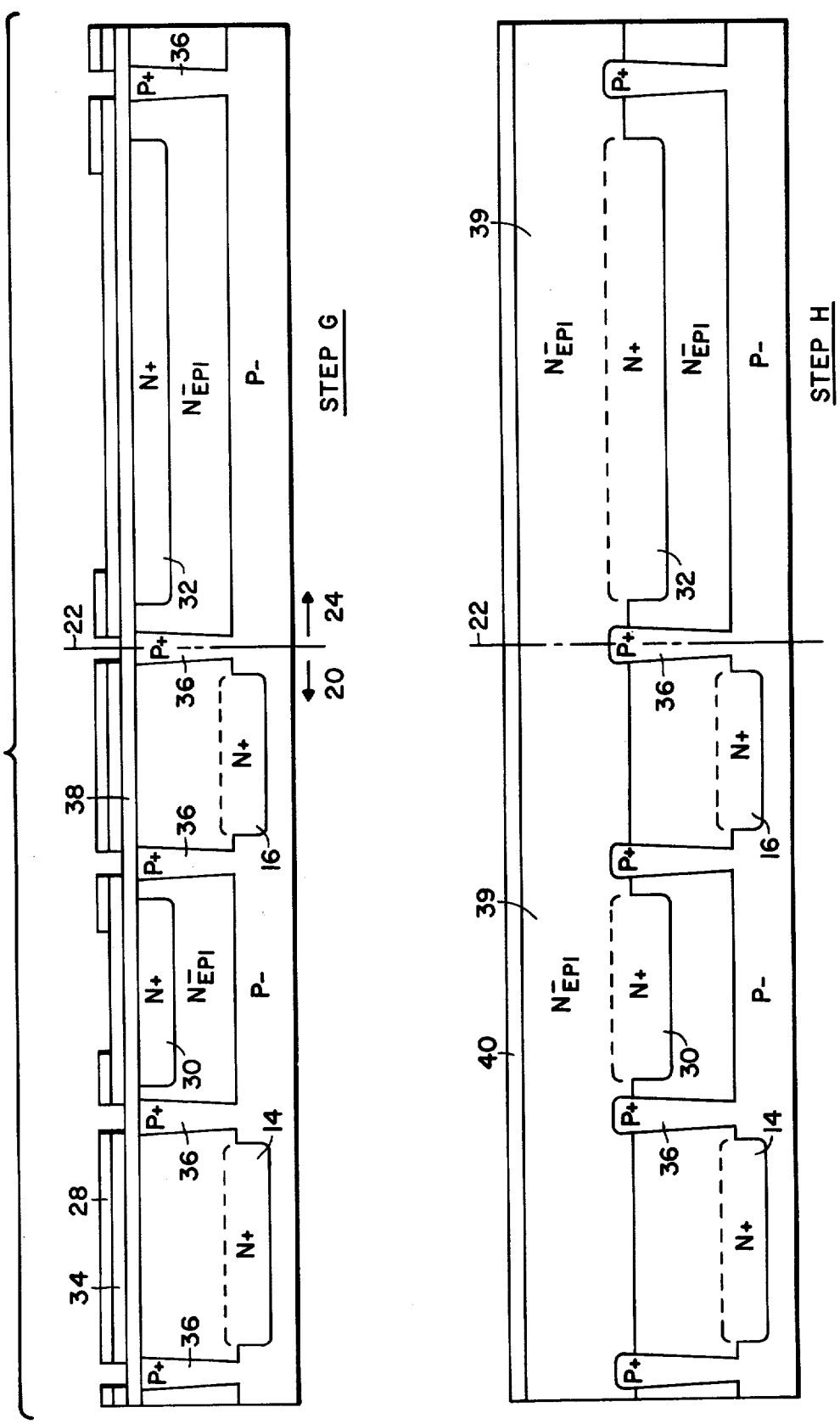
Figure 2:
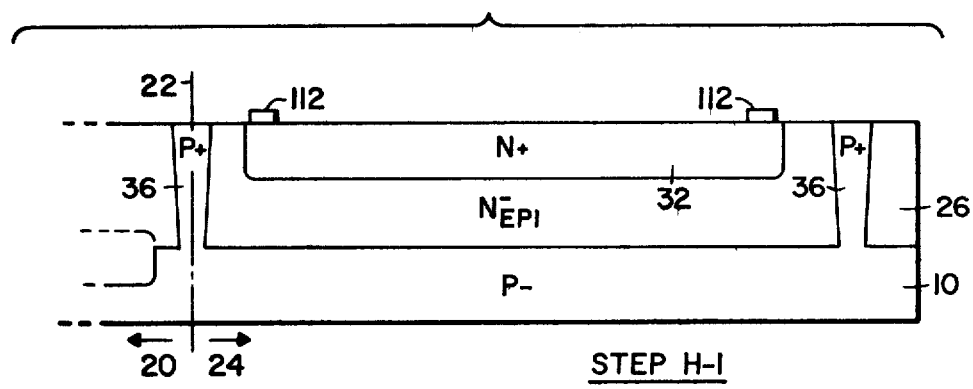
Figure 2:
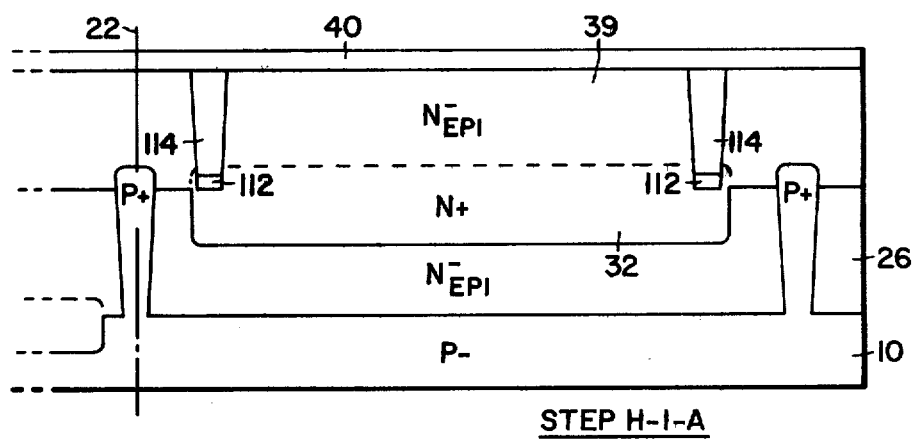
Figure 2:
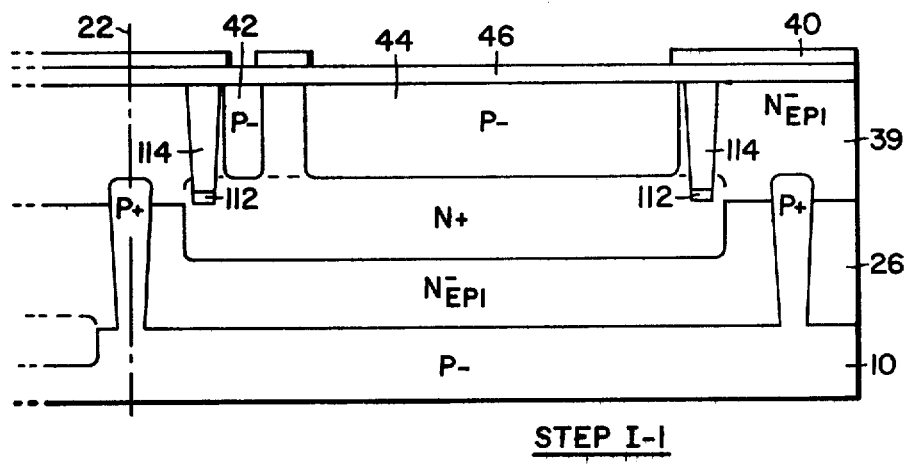
Figure 2:
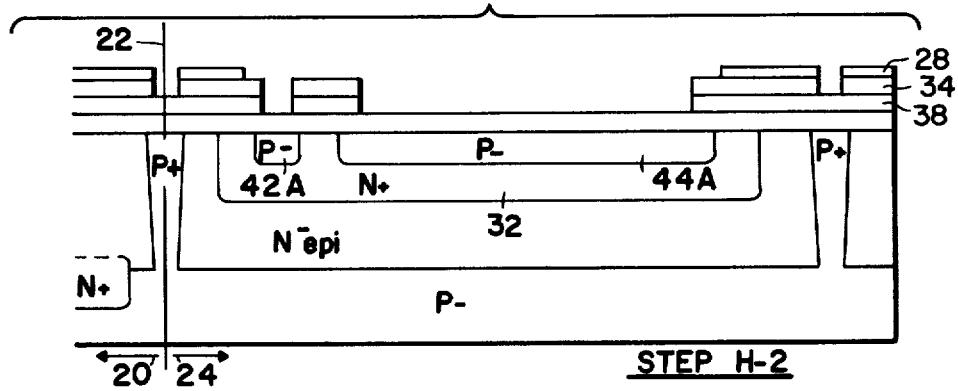
Figure 2:
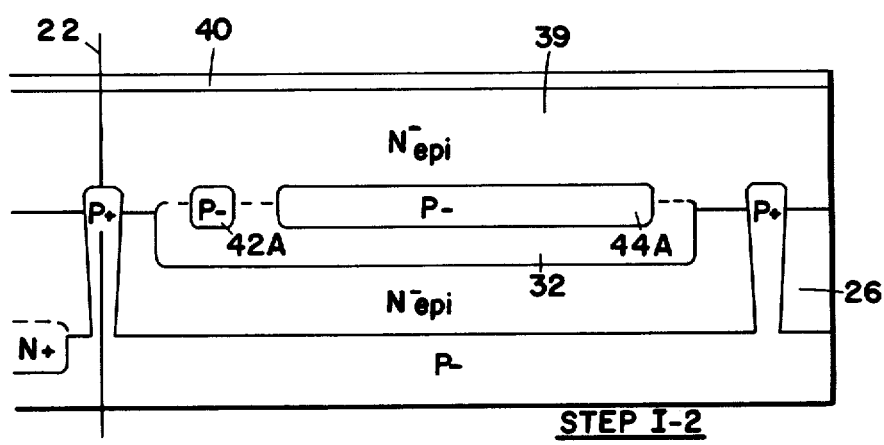
Figure 2:
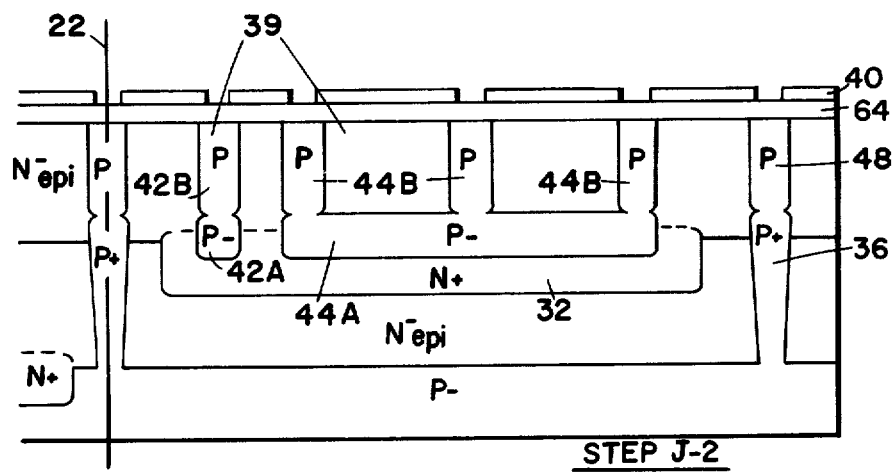
Figure 2:
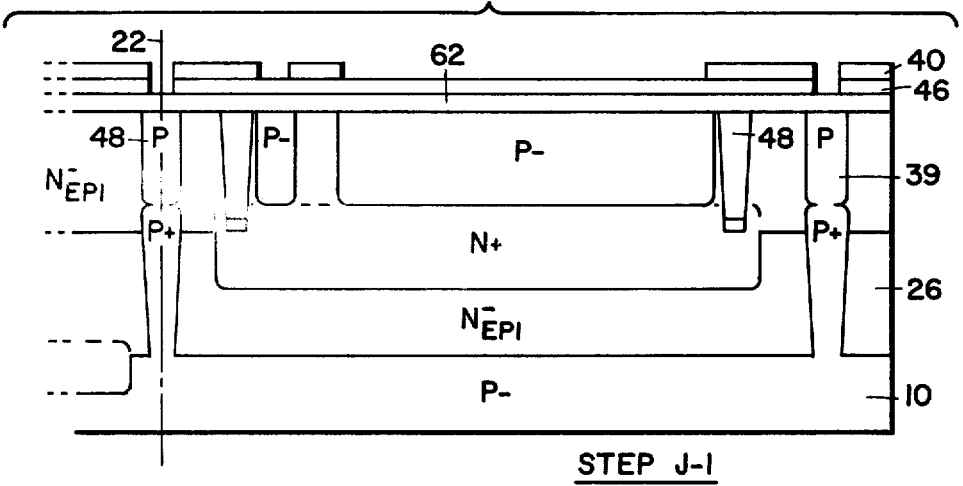
Figure 2:
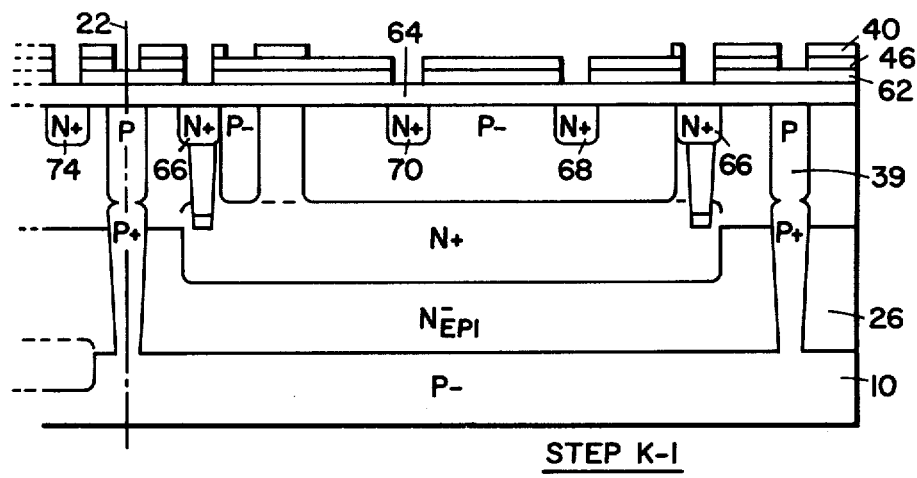
Figure 2:
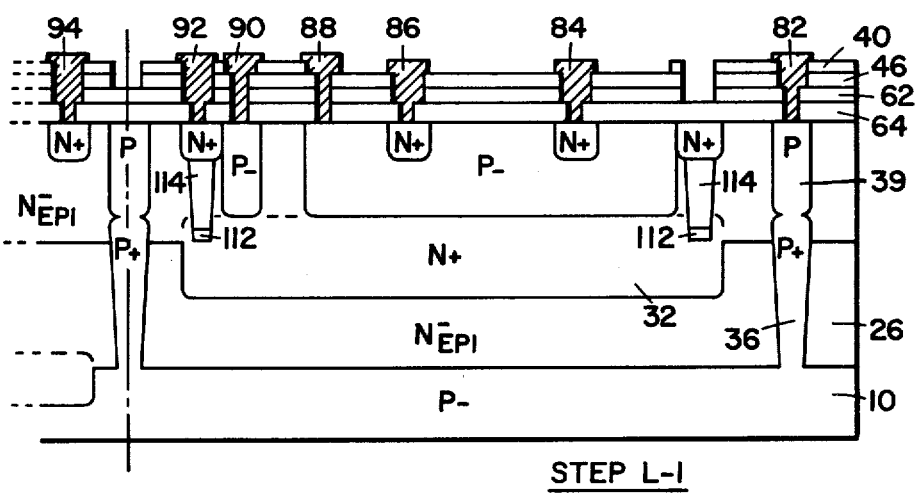
Figure 2:
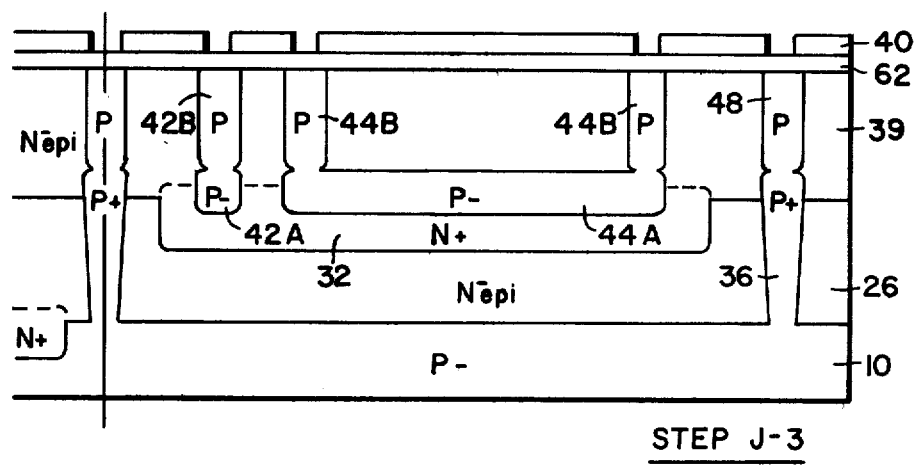
Figure 2:
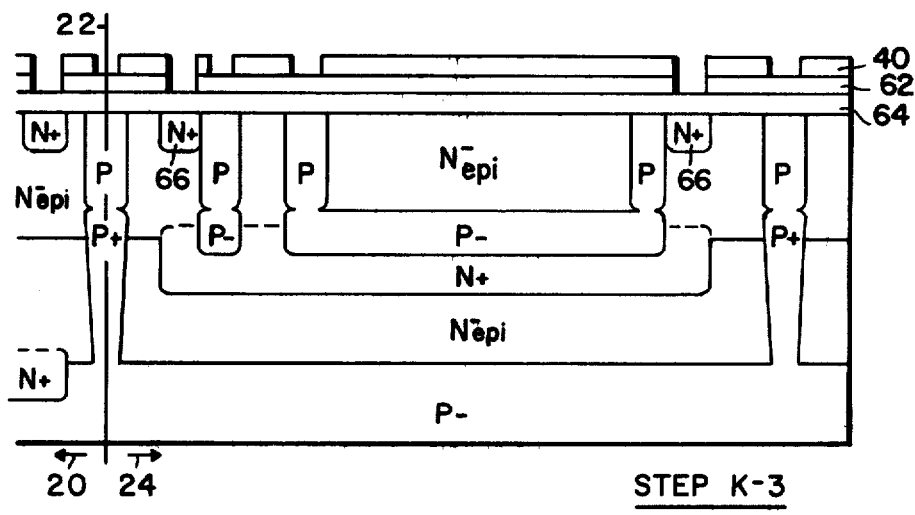
Figure 2:
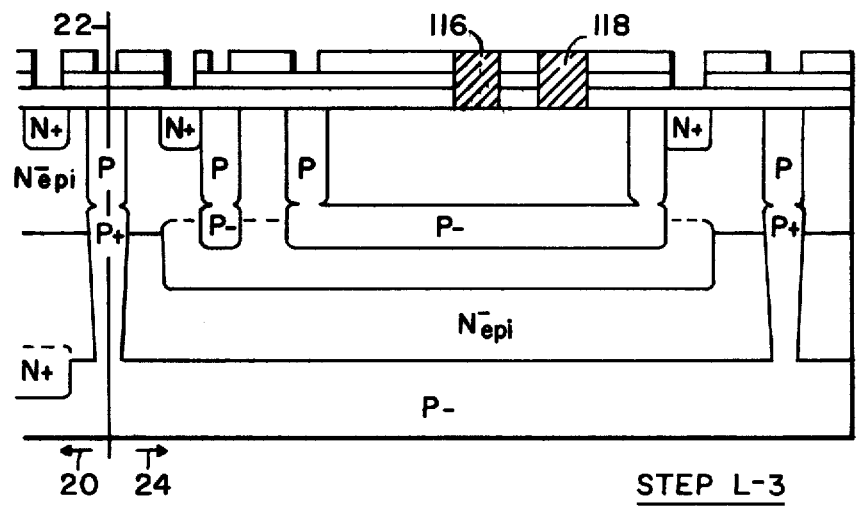
Figure 2:
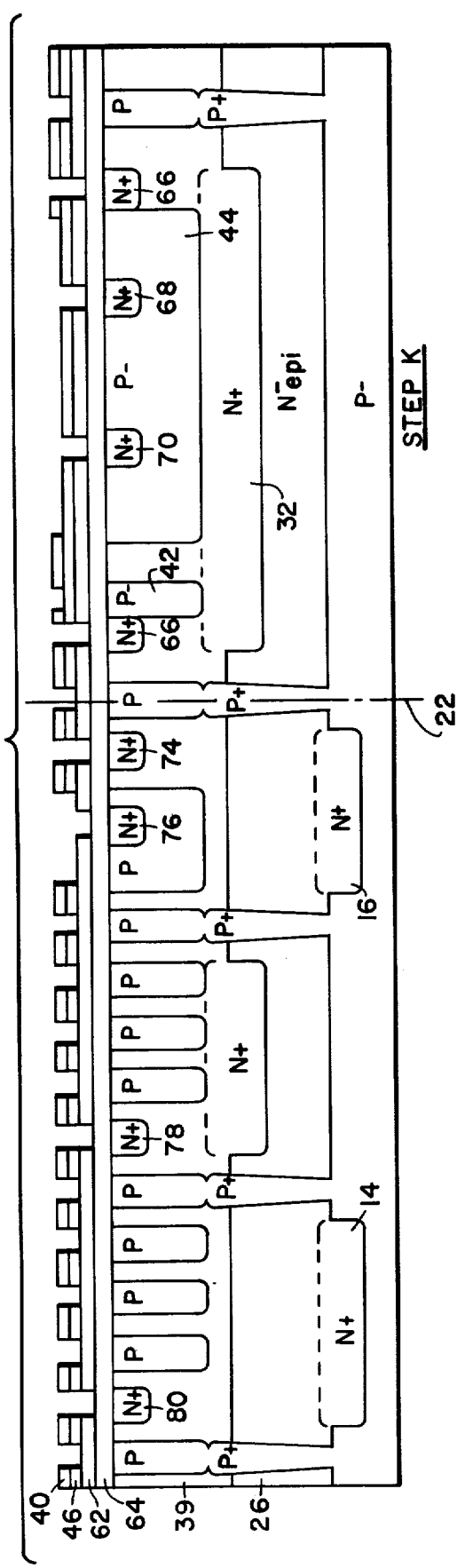
Figure 2:
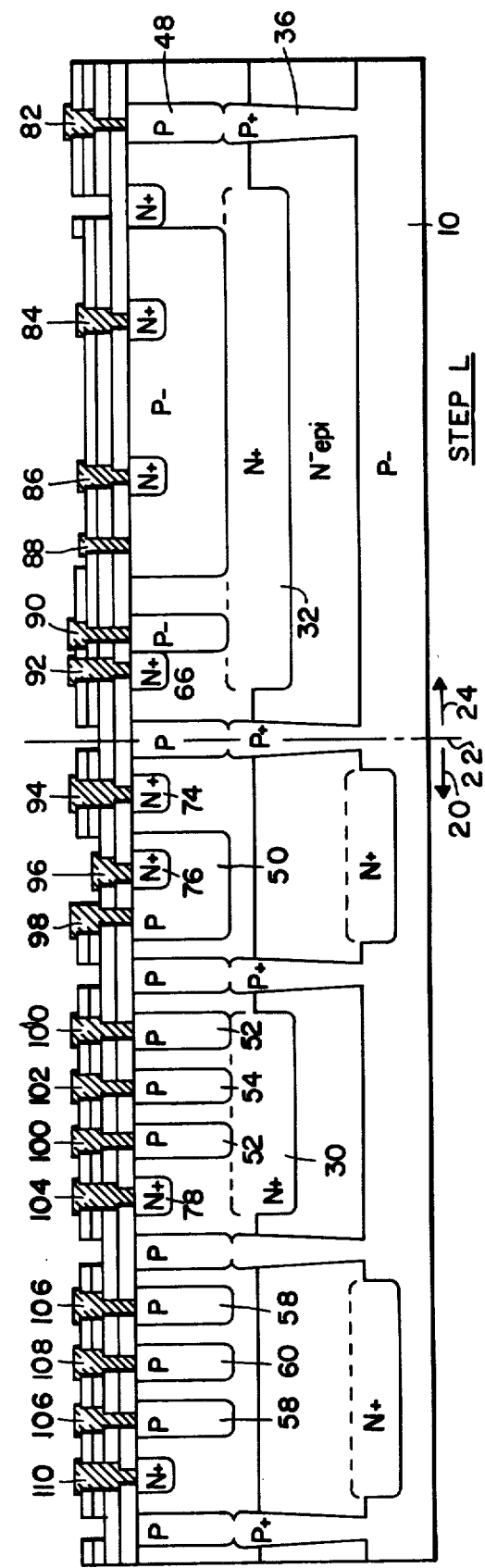
Figure 2:
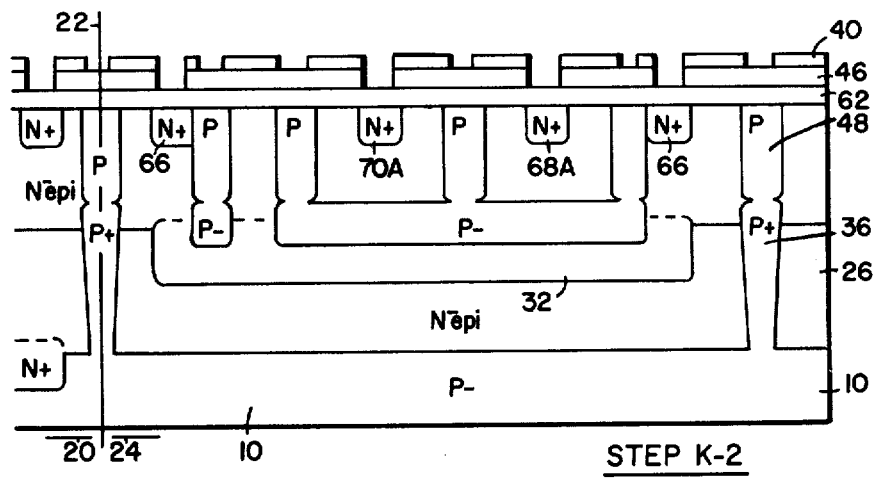
Figure 2:
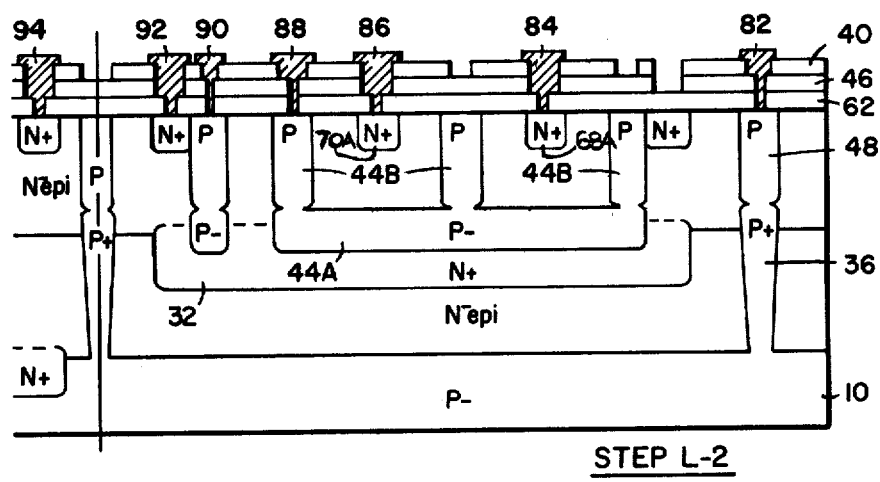
Figure 2:
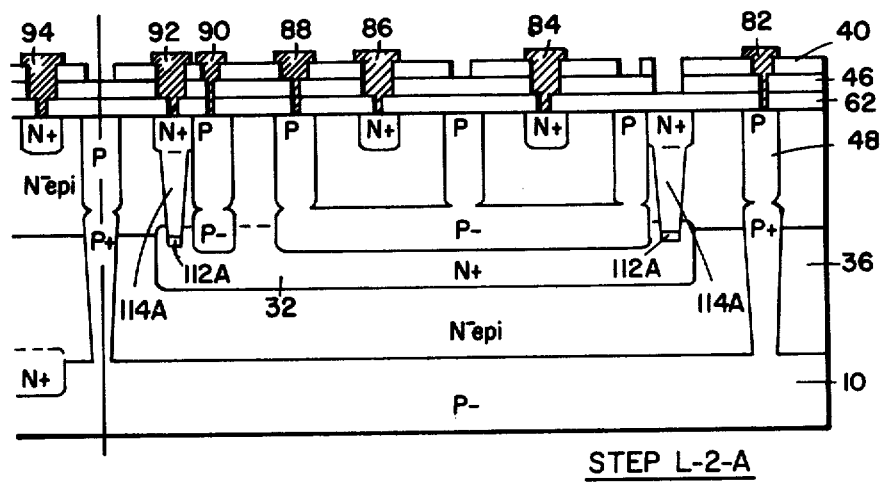
Figure 2:
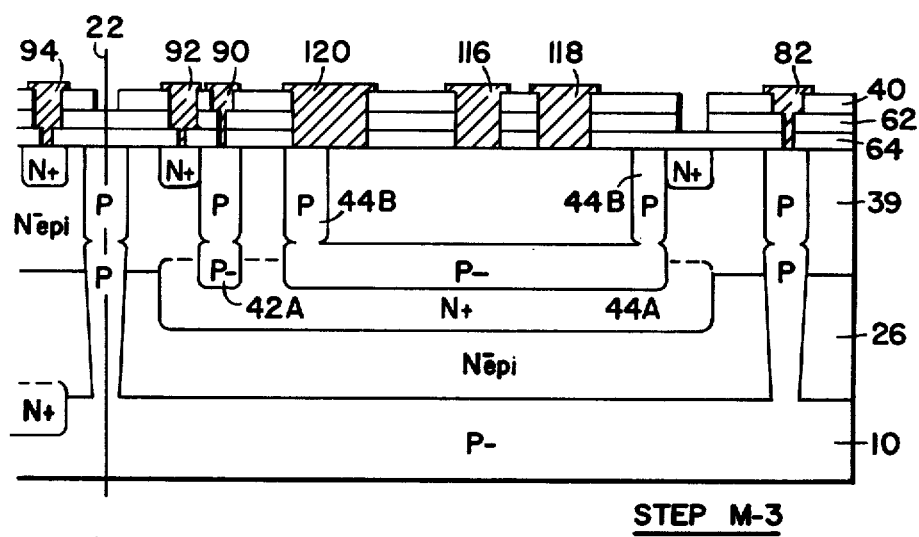
Figure 2:
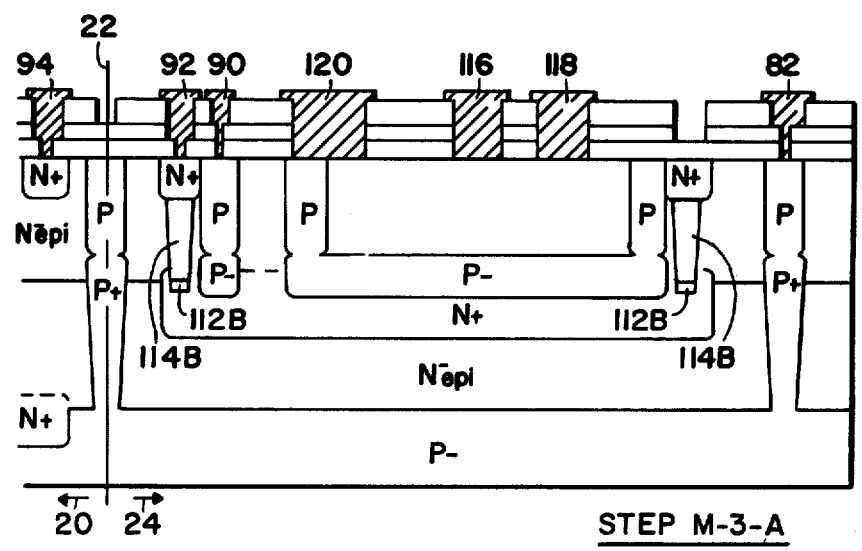

Referring to FIG. 1, a flow diagram, in outline form, is shown depicting the Steps of FIG. 2 together with the four main integrated structure variations plus the two additional integrated structure options. Steps A through L provides one of the four main variations to produce a monolithic integrated semiconductor structure in accordance with this invention. Steps A through L-1 (including Steps H-1, H-1-A, I-1, J-1, and K-1) provides the second of the four main variations to produce a monolithic integrated semiconductor structure in accordance with this invention. Steps A through L-2 (including Steps H-2, I-2, J-2, and K-2) provides the third of the four main variations to produce a monolithic integrated semiconductor structure in accordance with this invention. Step L-2-A provides the first of the two options associated with the four main integrated structure variations. Steps A through M-3 (including Steps H-2, I-2, J-3, K-3, and L-3) provides the fourth of the four main variations to produce a monolithic integrated semiconductor structure in accordance with this invention. Step M-3-A provides the second of the two options associated with the four main integrated structure variations.

Referring to Step A of FIG. 2, reference numeral 10 designates the starting P— substrate. The starting P— substrate is preferably made of silicon monocrystalline semiconductor material which is formed by conventional wafer fabrication techniques such as pulling a rod of P— type material from a melt that has been doped with P— type impurities such as Boron. The rod of monocrystalline silicon material is then cut into wafers and then polished to provide the starting P— Substrate 10. Preferably, the P— Substrate 10 has a thickness of about 17 mils and a resistivity of from 5 to 7 ohm-centimeters. It should be understood that while the specific embodiment disclosed in FIG. 2 starts with a P— substrate, this invention can also be practical with a starting substrate of N— type material. Thus all the succeeding steps after starting with a substrate of N— type material would be of opposite type conductivity than is shown for the embodiment of FIG. 2.

Referring to Step B of FIG. 2, preferably a thermal oxidation process is carried out to form a Silicon Dioxide Layer 12 on the starting P— substrate 10. The Silicon Dioxide Layer 12 is formed during a conventional thermal oxidation process step using an oxygen ambient in order to provide an insulating layer having preferably a thickness of about 10,000 Angstrom units. If desired, the Silicon Dioxide Layer 12 can be formed by other deposition techniques.

Referring to Step C of FIG. 2, a pair of openings are formed in the Silicon Dioxide Layer 12 using conventional photolithographic masking and oxide etching techniques. A N+ region 14 is formed through one of the openings in the Silicon Dioxide Layer 12 into the starting P— substrate 10 and another N+ region 16 is also formed in the starting substrate 10 through the other opening in the Silicon Dioxide Layer 12. Both of these N+ regions are formed simultaneously during a N type deposition.

During the drive-in diffusion operation to form the N+ regions 14 and 16, a Thermal Oxide Layer 18 is formed on the surface of the P— substrate 10 beneath the initial Silicon Dioxide Layer 12 because the drive-in diffusion is carried out in an oxygen ambient. Preferably, the N+ regions 14 and 16 which subsequently serve as buried layer regions or buried base and subcollector type regions are preferably formed with antimony type impurities which are of N type conductivity. The sheet resistance of the N+ regions 14 and 16 are preferably between 25 to 55 ohms per square and the depth of these regions are preferably about 6 microns. The thickness of the Silicon Dioxide Layer 18 is preferably no greater than about 5000 Angstroms. The N+ buried layer 14 is used as the buried base region and is located under the PNP type device that is subsequently formed in the linear portion of the integrated structure of FIG. 2 whereas the N+ buried layer 16 is used as the buried subcollector region for the NPN type device of the linear portion of the integrated structure of FIG. 2. The left side portion of the P— substrate 10 which incorporates both the N+ buried layer 14 and the N+ buried layer 16 is subsequently used to provide the linear portion of the integrated semiconductor structure of FIG. 2 as shown in Step C of FIG. 2. Thus, arrow 20 pointing to the left provides an indication that the linear portion of the integrated semiconductor structure of FIG. 2 is in the direction of the arrow 20 from a separation line 22 whereas the I²L portion of the integrated semiconductor structure of FIG. 2 is to the right of the separation line 22 and is in the direction shown by the arrow 24.

Referring to Step D of FIG. 2, the Silicon Dioxide Layers 12 and 18 are removed from the surface of the starting P— substrate 10 and an epitaxial deposition operation is carried out to grow a N— Epitaxial Layer 26 on the starting P— substrate 10 with its buried regions 14 and 16. The Epitaxial Layer 26 is preferably a phosphorous doped epitaxial layer preferably having a thickness of about 12 microns and a resistivity of about 4 to 7 ohm-centimeters. The impurity concentration is about $10^{15}$ impurities per cubic centimeter. This Epitaxial Layer 26 is subsequently designated as the first epitaxial layer of our linear-I²L combined monolithic integrated semiconductor structure.

Referring to Step E of FIG. 2, a Silicon Dioxide Layer 28 is formed on the N— Epitaxial Layer 26 by using conventional thermal oxide growth techniques. Preferably, the Oxide Layer 28 has a thickness of about 10,000 Angstroms.

Referring to Step F of FIG. 2, a pair of openings are formed in the thermally grown Silicon Dioxide Layer 28 with one of the pair of openings located on one side of the separation line 22 and the other of the pair of openings located on the other side of the separation line 22. These two openings are provided in order to permit the formation of a second series of N+ buried regions 30 and 32 in the N— Epitaxial Layer 26. Preferably, the N+ regions 30 and 32 are formed with antimony type impurities and are diffused into the N— Epitaxial Layer 26 using conventional oxide masking, etching, and diffusion techniques. The N+ buried Region 30 subsequently is used for enhancing the PNP semiconductor device that is to be formed above the N+ buried region 30 in the linear portion of the integrated semiconductor structure. The N+ buried region or layer 32, which is a much larger N+ region than the N+ buried region 30, functions to provide the emitter portion or region of the I²L transistor structure that is formed in the I²L portion of the monolithic integrated structure. The N+ buried regions 30 and 32 preferably have a sheet resistance of about 5 to 10 ohms per square and a depth of approximately 3 microns. As was shown earlier with respect to Step C of FIG. 2, and underlying Silicon Dioxide Layer 34 is formed beneath the initial Silicon Dioxide Layer 28 that is located on the N— Epitaxial Layer 26. This oxide layer is formed during the diffusion process which is carried out in an oxygen ambient to form the N+ regions 30 and 32.

Referring to Step G of FIG. 2, a P+ type isolation diffusion is carried out to form four isolated N type regions in the monolithic integrated structure. The four isolated N type regions are formed using the N— Epitaxial Layer 26 as the N type layer that is isolated in four separate parts by means of the isolation diffusion. By using standard photolithographic masking, etching, and diffusion techniques, four isolation walls are formed of P+ type material to provide the four isolated N type regions in the N— Epitaxial Layer 26. This is done by forming open channels in the Silicon Dioxide Layers 28 and 34 and subsequently carrying out a P+ diffusion step wherein preferably Boron impurities are diffused through the channel openings in the Silicon Dioxide Layers 34 and 28. Consequently, P+ isolation regions 36 are formed in the N− Epitaxial Layer 26. As can be seen with reference to Step G of FIG. 2, the three intermediate P+ isolation regions 36 share a common wall in the square or rectangular shaped isolation diffusion wall that is formed in the N− Epitaxial Layer 26. During the process of forming the P+ isolation region 36, a third Silicon Dioxide Layer 38 is formed on the upper surface of the Epitaxial Layer 26 similar to Steps C and F of FIG. 2.

At this point in the flow diagram process in fabricating the monolithic integrated structure of this invention, there are three separate paths or avenues (see FIG. 1) that the process could continue to follow to form various integrated semiconductor structures using the starting structure shown in Step G of FIG. 2.

One sequence of steps that would follow Step G of FIG. 2 to form one type of monolithic integrated structure is identified or described below as Steps H, I, J, K and L. This sequence of Steps completes a monolithic integrated structure shown in Step L which uses a double epitaxial layered structure wherein the linear portion thereof contains an NPN transistor structure (which is located closest to the I²L portion of the monolithic integrated structure) followed by a lateral PNP structure (also located in the linear area) with a N+ buried base region spaced closely beneath the lateral emitter and collector portions of the PNP device or structure for permitting higher gain to be achieved in this type of structure. Also included within the linear portion is a lateral PNP transistor structure which is also formed within the second epitaxial layer and the N+ buried base region 14 is formed beneath this lateral PNP device at the junction between the first epitaxial layer and the starting substrate 10.

The second avenue or path or sequence of Steps starting from Step G of FIG. 2, is a sequence of Steps identified as Steps H-1, H-1-A, I-1, J-1, K-1 and L-1 in order to form another type of monolithic integrated simiconductor structure wherein the I²L portion of the structure has a polysilicon isolation region.

The third avenue or path of Steps starting with Step G of FIG. 2 to form another monolithic integrated structure is identified as Steps H-2, I-2, J-2, K-2 and L-2. This sequence of Steps provides an I²L portion which has a P− region located on the N+ buried emitter region and also includes extended portions from that P− region which are P down-diffused regions (formed during the formation of the linear P type regions) to meet the P− base type portions in order to provide regions that are PN junction isolated and contain the collectors of the NPN transistor device formed in the I²L structure.

The fourth avenue or path of Steps starting with Step G of FIG. 2 to form another monolithic integrated structure is identified as Steps J-3, K-3, L-3 and M-3. This sequence of Steps provides a monolithic integrated semiconductor structure similar to Step L-2 with the major addition of self-isolating Schottky type collectors plus some other features.

FIRST ALTERNATE PATH

Referring to Step H of FIG. 2, the Silicon Dioxide Layers 28, 34, and 38 that were formed on the N− Epitaxial Layer 26 are removed and a second N− Epitaxial Layer 39 is formed on the first N− Epitaxial Layer 26. This second N− Epitaxial Layer 39 is much narrower in thickness than the first N− Epitaxial Layer 26. Preferably, the second N− Epitaxial Layer 39 has a thickness of about 3 microns and a resistivity of between about 4 to 7 ohm-centimeters. The impurity concentration of this N− Epitaxial Layer 39 is approximately $10^{15}$ impurities per cubic centimeter and the impurities used in this N− Epitaxial Layer 39 is preferably phosphorous. The second N− Epitaxial Layer 39 is approximately one-fourth the thickness of the underlying N− Epitaxial Layer 26. Subsequent to the formation of the second N− Epitaxial Layer 39, a Silicon Dioxide Layer 40 is grown, preferably by thermal oxide growth techniques, on the surface of the second N− Epitaxial Layer 39. This Silicon Dioxide Layer 40 preferably has a thickness of about 10,000 Angstroms.

Referring to Step I of FIG. 2, a pair of P− regions 42 and 44 are formed in the second N− Epitaxial Layer 39 by means of conventional photolithographic oxide masking and etching techniques followed by a P− type diffusion through openings formed in the Silicon Dioxide Layer 40. As was shown earlier, the Silicon Dioxide Layer 40 subsequently becomes the top layer of a two-layered silicon dioxide composite layered structure during the process of forming the P− diffused regions 42 and 44 which occurs in an oxygen atmosphere thereby causing the formation of an underlying Silicon Dioxide Layer 46. The P− regions 42 and 44 are preferably formed using Boron impurities and these regions have an impurity concentration of about $10^{17}$ impurities per cubic centimeter. The sheet resistance of the P− regions 42 and 44 can be selected, as desired, in the range of from about 200 to about 1000 ohms per square. The depth of the P− diffused regions 42 and 44 can be selected as desired, for optimization of the function of the device, but will generally be on the order of a few microns. The underlying Silicon Dioxide Layer 46 preferably has a thickness of about 2000 Angstrom units.

The function of the P− region 42 is to serve as the injector of the I²L portion of the final monolithic integrated structure. The function of the P− region 44 is to serve as the base of the I²L portion of the monolithic integrated structure. The I²L structure that is formed in the monolithic integrated structure which is located on the right side of the separation line 22 is a combined PNP-NPN integrated semiconductor structure wherein the N base portion of the PNP device is the N emitter of the NPN device so that the two complementary transistors are integrated together to provide a single I²L structure or device. The P collector of the PNP portion of the I²L structure is also the P base of the NPN device of the I²L structure. As shown in Step I of FIG. 2, the I²L portion of the total monolithic integrated structure is substantially completed (except for the N+ collectors) prior to the formation of the devices in the linear portion of the monolithic integrated structure due to the fact that the regions formed in the second epitaxial layer in the I²L portion of the integrated monolithic structure have higher resistivities and are therefore better defined and formed during the earlier portion of the process of forming the total monolithic integrated semiconductor structure incorporating both the I²L and linear portions of the device. However, if desired, it is possible to select a compromise P type diffused region which would be somewhat compatible for both sides (I²L and linear) of the total monolithic integrated structure and thereby form the P regions for both the I²L and linear portions of the total monolithic integrated structure at the same time rather than in two sequences of steps as shown in Steps I and J of FIG. 2. Thus, the formation of the structure shown in Step J would be done at one time (using a somewhat compatible P type diffused region) rather than in two steps as is shown in Steps I and J of this figure.

Referring to Step J of FIG. 2, additional oxide openings are formed in the linear portion of the monolithic integrated structure and over the epitaxial layer portion located above the buried P+ region 36 to provide openings in the silicon dioxide layers in order to carry out P type diffusion operations to provide the series of P type regions shown. These P type regions are identified as 48, 50, 52, 54, 58 and 60. As can be seen, the P type regions 48 are P diffused regions that are used to form isolation regions (by combining with and connecting to the up-diffused P+ region 36) in the second Epitaxial Layer 39 and thus provide four separate isolated pockets or regions in the Epitaxial Layer 39. All of these P type diffused regions are preferably Boron diffused regions which desirably have a junction depth of about 2.5 microns and a sheet resistance of about 135 to about 145 ohms per square. A third Silicon Dioxide Layer 62 is formed by thermal oxide growth techniques during the process of forming the P type diffused regions shown in Step J of FIG. 2.

With reference to the three PN junction isolated portions on the linear side of the monolithic integrated structure, the P type region 50 located in the PN junction isolated portion that is closest to the I²L portion of the monolithic integrated structure is formed in the N type Epitaxial Layer 39 and functions to act as the base region of the NPN transistor device that is to be subsequently formed in this portion of the linear side of the monolithic integrated structure. The function of the P type diffused regions 52 and 58 serve as the collector ring regions of the lateral PNP transistor devices that are formed in the intermediate and left side linear portions of the total monolithic integrated structure. The P type regions 54 and 60 in the intermediate and left side linear portions, respectively, serve as the emitter portion or region of the two lateral PNP transistor devices. The underlying N+ buried layer or region 30 is shown located close to the P type emitter and collector portions of the PNP lateral transistor device in order to increase the gain of the lateral PNP device by prohibiting vertical injection of holes from the P emitter 54. In both lateral PNP structures containing the emitter 54 and the emitter 60, the N base type region is the original N— Second Epitaxial Layer 39. The selection of junction depth is the choice of the monolithic integrated circuit designer or engineer and can be varied, as desired, to meet the optimum characteristics that is required for each of the different regions of the total monolithic integrated structure.

Referring to Step K of FIG. 2, an N+ diffusion operation is carried out after suitable openings are formed in the surface oxide layers which forms N+ regions 66, 68, 70, 74, 76, 78, and 80. These N+ Regions have a sheet resistance of about 3.5 to 4.5 ohms per square and a junction depth of about 2.0 microns. With reference to the I²L portion of the total monolithic integrated structure shown in Step K of FIG. 2, the N+ regions 66, 68, and 70 are shown located in the I²L portion of the total structure. The N+ region 66 is an encircling region that is preferably formed in a square or rectangular shaped pattern encircling the two P— regions 42 and 44 as shown in Step K of FIG. 2. Thus, the N+ region 66 serves as an isolation type ring in order to increase the efficiency of the total I²L transistor device. The N+ regions 68 and 70 function as separate (dual) collector regions for the NPN portion of the I²L integrated semiconductor structure. The N emitter region of the NPN portion of the I²L part of the total monolithic integrated structure is the N+ buried layer 32 which is shown located between the second Epitaxial Layer 39 and the first Epitaxial Layer 26. The base region of the NPN transistor portion of the I²L part of the monolithic integrated structure is the P— region 44.

Referring particularly to Step L of FIG. 2, metal contacts are formed to the various regions of the total monolithic integrated structure to provide a combined linear and I²L arrangement which can be interconnected as desired. Thus, an Ohmic Contact 82 is provided to the P type isolation region 48 and thus functions as an ohmic contact to the original starting P— substrate 10 by means of the intermediate connecting P+ region 36. Separate Ohmic Contacts 84 and 86 function to connect to the separate (dual) collector regions 68 and 70 which are of N+ type conductivity. These are the dual collector regions of the NPN portion of the I²L transistor structure. An Ohmic Contact 88 is provided to the P-type base region 44 which functions as the P base region of the NPN transistor portion of the I²L transistor structure. Ohmic Contact 90 serves as the electrical contact to the P— emitter region 42 of the PNP transistor portion of the I²L transistor structure. Ohmic Contact 92 is provided to the N+ isolation type region 66 in order to provide an electrical contact to this region which is electrically connected (by means of the N type Second Epitaxial Layer 39) to the N+ emitter region 32 of the NPN transistor portion of the I²L structure. The Second Epitaxial Layer 39 also serves as the N type base region of the PNP transistor portion of the I²L transistor structure or device. Thus, the N+ ring type region 66 is also (besides serving as the isolation ring) a low resistance contact to the N Epitaxial Layer 39. Ohmic Contact 94 is provided to the N+ collector region 74 of the NPN transistor shown on the linear side of the total monolithic integrated structure. This NPN transistor is a conventional vertical type bipolar transistor device and uses the N+ region 74 as the low resistance contact to the collector region which is the N— Epitaxial Layer 39. Ohmic Contact 96 provides electrical contact to the N+ region 76 which functions as the emitter region of the NPN vertical transistor device of the linear portion of the total monolithic integrated structure. Ohmic Contact 98 functions as the ohmic contact to the base portion of the NPN vertical transistor and is electrically connected to the P type base region 50. Ohmic Contact 100 is provided to the P type ring region 52 which encircles the P type emitter region 54 that is located within the Epitaxial Layer 39. The P type emitter region 54 is electrically connected to the outside world by means of the Ohmic Contact 102, and the Epitaxial Base Portion 39 of the PNP lateral transistor device is connected to the outside world by means of the low resistivity N+ region 78 and Ohmic Contact 104. Ohmic Contact 106 is connected to the P type Ring 58 (which encircles the P type emitter 60) and the P type Ring 58 functions as the surrounding collector of the lateral PNP device. Ohmic Contact 108 provides electrical connection to the P type Emitter 60 of the lateral PNP device. Ohmic Contact 110 is electrically connected to the N+ region 80 and thereby functions as the connection to the N type Epitaxial Layer 39 which serves as the base region for the lateral PNP transistor device.

SECOND ALTERNATE PATH

Referring to Step H-1 which is the start of the second alternate sequence of Steps starting from the monolithic integrated structure of Step G of FIG. 2 (the linear portion of the structure has been deleted in the second, third and fourth alternate sequence of Steps for ease of description), a Silicon Dioxide Ring 112 is formed on the N+ buried Layer 32 using conventional photolithographic oxide masking and etching techniques after the formation of a silicon dioxide layer on the first Epitaxial Layer 26.

Referring to Step H-1-A, the second Epitaxial Layer 39 is grown on the first Epitaxial Layer 26 and in the process of growing the second Epitaxial Layer 39 a polysilicon ring 114 is grown on the Silicon Dioxide Layer Ring 112. This polysilicon ring 114 functions in the final I²L portion of the total monolithic integrated structure as an effective isolation ring around the composite NPN-PNP I²L structure. This polysilicon isolation ring 114 also provides the additional function of permitting a very good electrical contact to be made to the buried N+ region 32 (which functions as the emitter of the NPN transistor portion of the I²L transistor structure). Steps I-1, J-1, K-1, and L-1 are substantially the same as Steps I, J, K, and L, respectively, with the only change being the formation of the Silicon Dioxide Ring 112 and the corresponding formation of the polysilicon ring 114. Thus, the reference numerals used for Steps I, J, K, and L are repeated, where applicable, for the corresponding Steps I-1, J-1, K-1, and L-1.

THIRD ALTERNATE PATH

The third alternate path that can be followed from the starting monolithic structure of Step G is designated by the sequence of Steps H-2, I-2, J-2, K-2, and L-2 of FIG. 2. Referring to Step H-2, by means of conventional photolithographic masking and etching techniques, a pair of P− type diffused regions 42A and 44A are formed in the N+ buried Layer 32 which is located within the I²L portion of the total monolithic integrated structure. The P− region 42A and the P− region 44A are Boron doped P type regions which have an impurity concentration of about $5 \times 10^{17}$ atoms per cubic centimeters. The P− region 42A functions the same as the equivalent P type region 42 of the I²L structure shown in Step L of FIG. 2 whereas the P− region 44A functions in the same manner as the P type region 44 of the I²L portion of the monolithic structure shown in Step L of FIG. 2.

Referring to Step I-2, the Second Epitaxial Layer 39 is grown on the first Epitaxial Layer 26 after all the surface silicon dioxide layers have been removed. Next, the Silicon Dioxide Layer 40 is grown on the surface of the second Epitaxial Layer 39 (which is similar to what was described above in Step H).

At this point the structure of Step I-2 can take two alternative paths to complete two different types of devices. One alternative path (which is the Third Alternate Path) utilizes the structures of Steps J-2 through L-2 (including the first option L-2-A). The other alternative path (which is the Fourth Alternative Path) takes the structure of Steps J-3 through M-3 (including the second option M-3-A).

Referring to the Third Alternative Path which incorporates Steps J-2 through L-2 (excluding the first option L-2-A), it can be seen that P type diffused regions 42B and 44B are formed in the I²L portion of the monolithic integrated structure in addition to the formation of the other P type regions which were earlier formed in Step J.

Thus, the P type region 42B, which is preferably a difussed region, connects up to the P− type region 42A that is out-diffused from its location in the buried N+ region 32. Accordingly, regions 42B and 42A together form the P type injector 42 that is shown in Step L of FIG. 2. Similarly, the P type region 44B provides extensions to the buried P− region 44A and together these regions provide the base type region 44 of Step L of FIG. 2. Furthermore, the P type region 44B is a series of interconnected regions which provide a pair of isolated N type regions. Thus, the N− epitaxial isolated regions in the Epitaxial Layer 39 which are isolated by means of the P type Isolation Moat 44B each serve as a separate collector region (dual collector) for the NPN portion of the I²L transistor structure.

Referring to Step K-2 of FIG. 2, N+ region 68A and N+ region 70A, which are each formed in separate N type isolation pockets, are equivalent in function and operation as the N+ regions 68 and 70 of Step L of FIG. 2.

Figure 4:
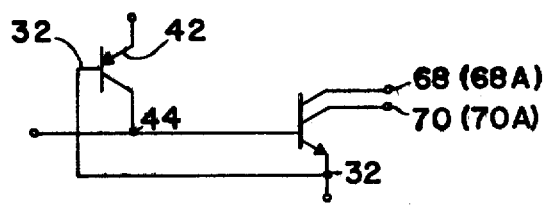
FIG. 4 is an electrical schematic representation of the first, second, and third variations (as shown in FIGS. 1 and 2).

Referring to FIG. 4, the electrical schematic shown in this figure represents the I²L portion of the monolithic integrated structure of Step L, Step L-1, and Step L-2 of FIG. 2. The structure of Step L-2 provides significant advantages in that the I²L portion uses up-diffused P type base regions. The linear portion of the total structure uses conventional down-diffused P type base regions. Thus, both the I²L and linear portions of the total integrated structure can operate with optimum efficiency and better device characteristics. Step L-2 provides a heavily doped N+ emitter region in the I²L portion together with a graded P− base profile which has a higher P type concentration in the direction of the N+ emitter. Furthermore, the L-2 I²L structure has a very low collector series resistance for the NPN portion of the I²L transistor structure.

If desired, a polycrystalline silicon isolation type ring can also be formed in the embodiment shown by Steps J-2 to L-2 by means of forming an oxide ring similar to the ring 112 in Step H-1 and then forming a polycrystalline silicon ring 114 (as in Step H-1-A) on top of the oxide ring. This optional structure (the first option) is shown in final form in Step L-2-A. Thus, referring to Step L-2-A, the oxide ring is shown as Oxide Ring 112A and the polysilicon ring is shown as Polysilicon Ring 114A.

FOURTH ALTERNATE PATH

The fourth alternate path starting from the monolithic integrated structure of Step I-2, which is part of the Third Alternate Path, is shown in the sequence of Steps starting with Steps J-3 through M-3 (excluding Step M-3-A which is the second option). This sequence of Steps is used to form the N up-diffused I²L type transistor structure with Schottky type collector diodes. In this sequence of Steps, the structure that is formed is very similar to the structure that is formed in the sequence of Steps leading to the final structure of Step L-2. However, there is only one collector type isolation pocket formed in the I²L portion of the integrated semiconductor structure (which is located above the buried P− region 44A). As can be seen with reference to Steps J-3 through L-3, this single isolated N type collector pocket (located above the P− type buried Layer 44A with its P type collector isolation ring 44B) functions to permit the connection thereto of Titanium Schottky Collector Diodes 116 and 118 as shown in Step L-3. The Titanium Schottky Collector Diodes 116 and 118 are formed by means of making openings in the silicon dioxide layer that is located over the N isolated collector region or pocket.

Figure 3:
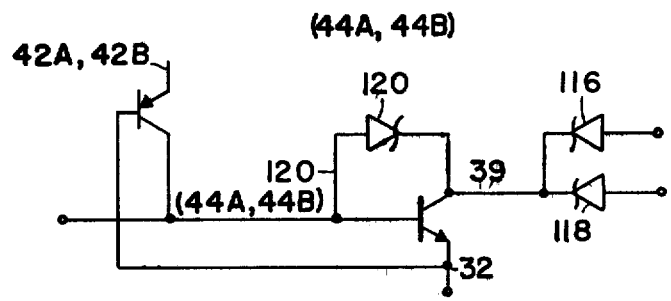
FIG. 3 is an electrical schematic representation of the I²L portion of the fourth variation (as shown in FIGS. 1 and 2).

Referring to Step M-3 of FIG. 2, the Titanium Schottky Diodes 116 and 118 are effectively the anode portions of the diode devices 116 and 118 shown in FIG. 3 (which is an electrical schematic representation of the I²L portion with the Schottky Diode embodiment of Step M-3). With particular reference to Step M-3, an additional Schottky type diode is formed in the monolithic integrated structure by means of opening up a window in the oxide layer on the second epitaxial layer above the region where the PN junction (formed by P type region 44B and N− Epitaxial Layer 39 located above the buried P− type region 44A) and depositing a metal in opening in the oxide layer. The metal used here for this Schottky Diode 120 is preferably aluminum and provides the Schottky type diode contact. Reference is made to FIG. 3 which shows the electrical schematic of the I²L portion of the monolithic integrated structure of Step M-3 and the second option M-3-A. The use of the Schottky Diodes 116, 118, and 120 permit the I²L structure to have greater speed because it requires a smaller voltage signal for switching. The Schottky Diode 120 functions as an anti saturation diode clamp.

The structure of Step M-3-A is substantially equivalent to the structure of Step M-3 with the additional formation of the Polysilicon Ring 114B and the underlying Silicon Dioxide Ring 112B which are formed similar to the previously described equivalent elements in the earlier Steps H-1, H-1-A, and L-2-A.

Figure 5:
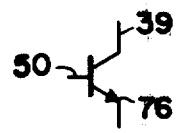
FIG. 5 is an electrical schematic representation of the NPN linear device located in the linear portion of the monolithic integrated semiconductor structure of FIG. 2.
Figure 6:
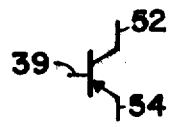
FIG. 6 is an electrical schematic representation of the modified PNP device of the linear portion of the monolithic integrated semiconductor structure of FIG. 2.
Figure 7:
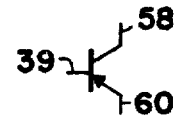
FIG. 7 is an electrical schematic representation of the lateral PNP device located in the linear portion of the monolithic integrated semiconductor structure of FIG. 2.

FIGS. 5, 6 and 7 are, respectively, the electrical schematics of the equivalent semiconductor devices shown as the NPN transistor of the linear portion, the lateral PNP transistor device of the linear portion that is located next to the NPN transistor device, and the lateral PNP transistor device of the linear portion that is located on the extreme left side of the semiconductor structure shown in Steps L and L-1.

While the invention has been particularly shown and described in reference to the preferred embodiment thereof, it will be understood by those skilled in the art that changes in the form and details may be made therein without departing from the spirit and scope of the invention.

We claim:

1. A bipolar integrated semiconductor structure comprising, in combination, a first portion having at least one linear type bipolar device having emitter, base and collector regions; a second portion separated in said structure from said first portion and having at least one I²L type bipolar device having emitter, base and collector regions, said structure having a substrate, a first epitaxial layer located on said substrate, and a second epitaxial layer located on said first epitaxial layer, said linear type bipolar device having one of a subcollector and a subbase region located in a region encompassing a portion of the intersection between said substrate and said first epitaxial layer, said I²L type bipolar device having a subemitter region located in a region encompassing a portion of the intersection between said first epitaxial layer and said second epitaxial layer, said one of a subcollector and a subbase region of said linear type bipolar device and said subemitter region of said I²L type bipolar device being of the same conductivity type.

2. A bipolar integrated semiconductor structure in accordance with claim 1 wherein said linear type bipolar device being a lateral type bipolar device, said linear lateral type bipolar device having a subbase region located between said substrate and said first epitaxial layer.

3. A bipolar integrated semiconductor structure in accordance with claim 1 wherein said linear type bipolar device being a vertical type bipolar device, said linear vertical type bipolar device having a subcollector region located between said substrate and said first epitaxial layer.

4. A bipolar integrated semiconductor structure in accordance with claim 1 including another linear lateral type bipolar device, said another linear lateral type bipolar device having a subbase region located between said first epitaxial layer and said second epitaxial layer.

5. A bipolar integrated semiconductor structure in accordance with claim 4 wherein said another linear lateral type bipolar device having both the emitter and collector regions in contact with said subbase region.

6. A bipolar integrated semiconductor structure in accordance with claim 5 wherein said collector region completely surrounds said emitter region.

7. A bipolar integrated semiconductor structure in accordance with claim 1 wherein said I²L type bipolar device comprising a vertical type device and a lateral type device, the base of said vertical type device being the collector of said lateral type device.

8. A bipolar integrated semiconductor structure in accordance with claim 7 wherein said vertical type device being a NPN type device, said lateral type device being a PNP type device.

9. A bipolar integrated semiconductor structure in accordance with claim 8 wherein said base of said NPN vertical type device being a P− type region.

10. A bipolar integrated semiconductor structure in accordance with claim 8 wherein said emitter of said PNP lateral type device being a P− type region.

11. A bipolar integrated semiconductor structure in accordance with claim 9 wherein said emitter of said PNP lateral type device being a P− type region.

12. A bipolar integrated semiconductor structure in accordance with claim 7 wherein said linear type bipolar device being a lateral type bipolar device, said linear lateral type bipolar device having a subbase region located between said substrate and said first epitaxial layer.

13. A bipolar integrated semiconductor structure in accordance with claim 7 wherein said linear type bipolar device being a vertical type bipolar device, said linear vertical type bipolar device having a subcollector region located between said substrate and said first epitaxial layer.

14. A bipolar integrated semiconductor structure in accordance with claim 13 including another linear lateral type bipolar device, said another linear lateral type bipolar device having a subbase region located between said first epitaxial layer and said second epitaxial layer.

15. A bipolar integrated semiconductor structure in accordance with claim 14 wherein said another linear lateral type bipolar device having both the emitter and collector regions in contact with said subbase region.

16. A bipolar integrated semiconductor structure in accordance with claim 15 wherein said collector region completely surrounds said emitter region.

17. A bipolar integrated semiconductor structure in accordance with claim 1 wherein said I²L type bipolar device having a polysilicon isolation ring surrounding said I²L type bipolar device.

18. A bipolar integrated semiconductor structure in accordance with claim 17 including a high conductivity semiconductor region in contact with said polysilicon isolation ring.

19. A bipolar integrated semiconductor structure in accordance with claim 18 including a metal ohmic contact in contact with said high conductivity semiconductor region.

20. A bipolar integrated semiconductor structure in accordance with claim 7 wherein said base region of said vertical type device of said I²L type bipolar device having a higher resistivity portion and a lower resistivity portion, said higher resistivity portion being in contact with said subemitter region.

21. A bipolar integrated semiconductor structure in accordance with claim 7 wherein said emitter region of said lateral type device having a higher resistivity portion and a lower resistivity portion, said higher resistivity portion being in contact with said subemitter of said vertical type device.

22. A bipolar integrated semiconductor structure in accordance with claim 20 wherein said higher resistivity portion being a P− type region and said lower resistivity portion be a P type region.

23. A bipolar integrated semiconductor structure in accordance with claim 21 wherein said higher resistivity portion being a P− type region and said lower resistivity portion being a P type region.

24. A bipolar integrated semiconductor structure in accordance with claim 20 wherein said I²L type bipolar device having a polysilicon isolation ring surrounding said I²L type bipolar device.

25. A bipolar integrated semiconductor structure in accordance with claim 21 wherein said I²L type bipolar device having a polysilicon isolation ring surrounding said I²L type bipolar device.

26. A bipolar integrated semiconductor structure in accordance with claim 20 wherein said collector of said vertical type device of said I²L type bipolar device being at least one Schottky type collector diode.

27. A bipolar integrated semiconductor structure in accordance with claim 21 wherein said collector of said vertical type device of said I²L type bipolar device being at least one Schottky type collector diode.

28. A bipolar integrated semiconductor structure in accordance with claim 26 including a Schottky type base-collector anti-saturation diode connected to the base and collector regions of said vertical type device of said I²L type bipolar device.

29. A bipolar integrated semiconductor structure in accordance with claim 27 including a Schottky type base-collector anti-saturation diode connected to the base and collector regions of said vertical type device of said I²L type bipolar device.

* * * * *